US009083186B2

(12) United States Patent
Aoyagi (10) Patent No.: US 9,083,186 B2
(45) Date of Patent: Jul. 14, 2015

(54) SEMICONDUCTOR DEVICE HAVING POWER SOURCE SELECTION CIRCUIT AND METHOD FOR SELECTING POWER SOURCE

(71) Applicant: FUJITSU LIMITED, Kawasaki-shi, Kanagawa (JP)

(72) Inventor: Takahiro Aoyagi, Foster City, CA (US)

(73) Assignee: FUJITSU LIMITED, Kawasaki (JP)

( * ) Notice: Subject to any disclaimer, the term of this patent is extended or adjusted under 35 U.S.C. 154(b) by 305 days.

(21) Appl. No.: 13/888,711

(22) Filed: May 7, 2013

(65) Prior Publication Data

US 2014/0021791 A1    Jan. 23, 2014

(30) Foreign Application Priority Data

Jul. 20, 2012    (JP) .................. 2012-161411

(51) Int. Cl.
*H03K 19/177*    (2006.01)
*G11C 5/14*    (2006.01)
*H02J 1/00*    (2006.01)
*G11C 11/417*    (2006.01)

(52) U.S. Cl.
CPC . *H02J 1/00* (2013.01); *G11C 5/147* (2013.01); *G11C 11/417* (2013.01); *Y10T 307/696* (2015.04)

(58) Field of Classification Search
USPC .................. 326/40–41, 44, 47, 49, 31, 33–34; 327/524, 530, 547, 538, 543
See application file for complete search history.

(56) References Cited

U.S. PATENT DOCUMENTS 5,486,774 A * 1/1996 Douseki et al. .................. 326/33
7,079,443 B2 * 7/2006 Takita et al. ............. 365/230.06
7,636,039 B2 * 12/2009 Babich .......................... 340/514

FOREIGN PATENT DOCUMENTS

JP    08-316818    11/1996

* cited by examiner

*Primary Examiner* — Douglas W Owens
*Assistant Examiner* — James H Cho
(74) *Attorney, Agent, or Firm* — Fujitsu Patent Center (57) ABSTRACT

A semiconductor device includes a power source selection circuit configured to turn on and off each of a plurality of power source switches. The power source selection circuit includes a power source selection unit configured to select one power source from among the plurality of power sources, and a feedback control unit configured to output an on command signal to turn on an electrical connection between the selected power source and the electric circuit to a power source switch to be connected to the selected power source. When the power source selection unit switches a power source to select to another, the feedback control unit feeds back a signal indicative of that an off command signal to turn off electrical connections between the plurality of power sources and the electric circuit has been output to all of the plurality of power source switches at a predetermined delay time.

4 Claims, 7 Drawing Sheets

SEMICONDUCTOR DEVICE HAVING POWER SOURCE SELECTION CIRCUIT AND METHOD FOR SELECTING POWER SOURCE

CROSS-REFERENCE TO RELATED APPLICATION

This application is based upon and claims the benefit of priority of the prior Japanese Patent Application No. 2012-161411, filed on Jul. 20, 2012, the entire contents of which are incorporated herein by reference.

FIELD

The embodiments discussed herein relate to a semiconductor device having a power source selection circuit and a method for selecting a power source.

BACKGROUND

In recent years, as the number of transistors mounted on a semiconductor device increases, it is desired to reduce power consumption of a semiconductor device. For example, it is known to prevent occurrence of a current flowing from a positive power source VDD to a negative power source VSS by controlling a pMOS transistor and an nMOS transistor connected in series between a pair of power source points including the positive power source VDD and the negative power source VSS so as to not turn on at the same time.

Further, the degree of miniaturization of a transistor mounted on a semiconductor device increases and the ratio accounted for by a leak current of a transistor in the amount of power consumption increases, and therefore, a reduction in the leak current of a transistor has become a big challenge in power saving of a semiconductor device.

In a semiconductor device referred to a system LSI, a large number of memory cells, such as SRAM cells, are mounted, and therefore, it is desired to reduce the leak current of the memory cells for power saving of the system LSI.

The power source of a memory cells which are not in use are turned off, in order to reduce the leak current of the memory cells. However it is desirable for the memory cells to store data even while not in use, and therefore, it is not preferable to turn off the power source of the memory cells even if the memory cells are not in use.

In such circumstances, it is known to supply power to memory cells from two power sources, i.e., a normal power source and a sleep power source in order to reduce the leak current of the memory cells. When the memory cells are not in use, the normal power source is switched to the sleep power source having an electric potential about 0.01 V higher than that of the normal power source that is grounded. Then, it is possible to reduce the leak current by reducing the voltage applied to the memory cell when the memory cells are not in use.

RELATED DOCUMENTS

[Patent Document 1] Japanese Laid Open Patent Document No. 08-316818

SUMMARY

According to a first aspect of the embodiment, a semiconductor device includes a plurality of power source switches connected between a plurality of power sources and an electric circuit, respectively, and configured to turn on and off electrical connections between the plurality of power sources and the electric circuit, and a power source selection circuit configured to turn on and off each of the plurality of power source switches. The power source selection circuit includes a power source selection unit configured to select one power source from among the plurality of power sources, and a feedback control unit configured to output an on command signal to turn on an electrical connection between the selected power source and the electric circuit to a power source switch to be connected to the selected power source. When the power source selection unit switches a power source to select to another, the feedback control unit feeds back a signal indicative of that an off command signal to turn off electrical connections between the plurality of power sources and the electric circuit has been output to all of the plurality of power source switches at a predetermined delay time.

The object and advantages of the embodiments will be realized and attained by means of the elements and combination particularly pointed out in the claims.

It is to be understood that both the foregoing general description and the following detailed description are exemplary and explanatory and are not restrictive of the invention.

DESCRIPTION OF EMBODIMENTS

Figure 1A:
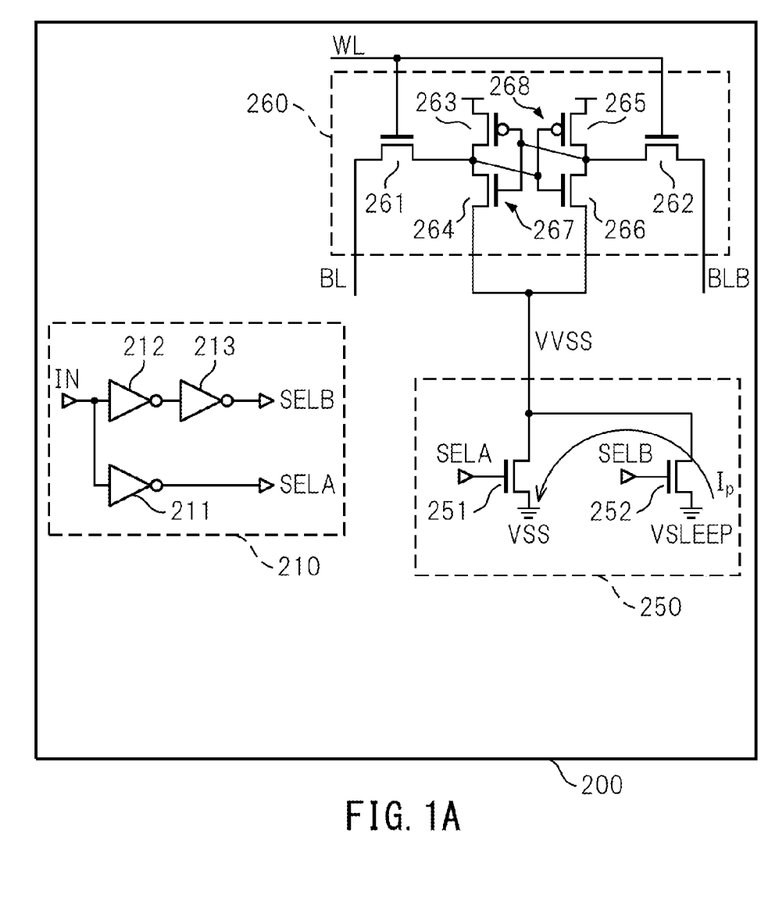
FIG. 1A is a diagram illustrating a conventional power source selection circuit of SRAM cells.

FIG. 1A is a diagram illustrating a conventional power source selection circuit of SRAM cells which is supplied a power source from two power sources, i.e., a normal power source and a sleep power source.

A negative power source terminal VVSS of an SRAM cell 260 mounted on a semiconductor device 200 is connected to a normal power source VSS and a sleep power source VSLEEP, respectively, via a first and a second power source switch 251 and 252. A first selection signal SELA is input to the gate terminal of the first power source switch 251. The first selection signal SELA is an inverted signal of a selection input signal IN to be input to the input terminal of a power source selection unit 210. On the other hand, a second selection signal SELB is input to the gate terminal of the second power source switch 252. The second selection signal SELB is a non-inverted signal of the selection input signal IN to be input to the input terminal of the power source selection unit 210. The negative power source terminal VVSS of the SRAM cell 260 is connected to one of the normal power source VSS and the sleep power source VSLEEP, by switching signal levels of the selection input signal IN.

Figure 1B:
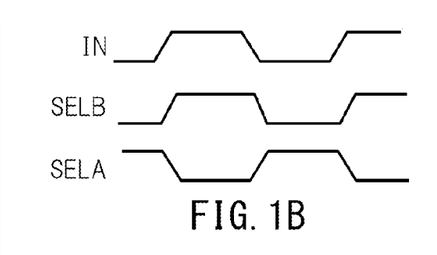
FIG. 1B is a diagram illustrating a timing chart of the memory cell illustrated in FIG. 1A.

FIG. 1B is a diagram illustrating a timing chart of the memory cell illustrated in FIG. 1A.

When the selection input signal IN transits from an L level to an H level, the first selection signal SELA transits from the H level to the L level and the second selection signal SELB transits from the L level to the H level. Then, the power source connected to the negative power source terminal VVSS of the SRAM cell 260 is switched from the normal power source VSS to the sleep power source VSLEEP. On the other hand, when the selection input signal IN transits from the H level to the L level, the first selection signal SELA makes transition from the L level to the H level and the second selection signal SELB transits from the H level to the L level. Then, the power source connected to the negative power source terminal VVSS of the SRAM cell 260 is switched from the sleep power source VSLEEP to the normal power source VSS.

When the normal power source VSS and the sleep power source VSLEEP are switched by switching the levels of the selection input signal IN, both the first power source switch 251 and the second power source switch 252 turn on and a through current flows from the sleep power source VSLEEP to the normal power source VSS. A through current that occurs when the normal power source VSS and the sleep power source VSLEEP are switched is represented by an arrow $I_p$. The electric potential difference between the normal power source VSS and the sleep power source VSLEEP is not large, and therefore, a through current that occurs at the time of switching in one SRAM cell 260 is also not large. However, a large number of the SRAM cells 260 are mounted on the semiconductor device 200, and therefore, the sum of the through currents $I_p$ flowing through the semiconductor device 200 becomes large. In particular, in the case where the period of time during which both the first power source switch 251 and the second power source switch 252 are turned on is lengthened due to manufacturing variations in transistors, the ratio accounted for by the through current $I_p$ in power consumption becomes large.

Further, there is a case where a power source device which is connected to the sleep power source VSLEEP has a function to turn off when a reverse current in a predetermined amount or more is detected in order to protect the power source. In this case, there is a possibility that the through current $I_p$ flowing out from the sleep power source VSLEEP is detected as a reverse current and the power source device which is connected to the sleep power source VSLEEP stops.

As described above, the semiconductor device 200 which mounts the SRAM cell 260 is desired to prevent occurrence of the through current $I_p$ when both the first power source switch 251 and the second power source switch 252 turn on. In order solve this problem, various ways have been proposed.

As a first way, deepening (increase) a threshold value $V_{th}$ of both the first power source switch 251 and the second power source switch 252, i.e., raise the threshold value of both the first power source switch 251 and the second power source switch 252. By raising the threshold value $V_{th}$ of both the first power source switch 251 and the second power source switch 252, the period of time during which both the first power source switch 251 and the second power source switch 252 are turned on can be eliminated. However, if the threshold value $V_{th}$ of the first and the second power source switch 251 and 252 is raised, the on-current of the transistor reduces and the operation speed of the SRAM cell 260 reduces.

As a second way, controlling the switching signal to be input to the gate terminals of the first and the second power source switch 251 and 252 by a clock signal. However, three pieces of processing, i.e., processing to change the value of the switching signal, processing to turn off all the switching signals, and processing to turn on only one switching signal are performed, and the time corresponding to a plurality of cycles of the clock signal is desired. Further, there is a possibility that the circuit scale of the power source switch circuit increases if a circuit for clock synchronization is mounted.

As a third way, controlling the first and the second power source switch 251 and 252 from outside of the semiconductor device 200 by connecting the gate terminals of the first and the second power source switch 251 and 252 to an external pad of the semiconductor device 200. However, if the gate terminals of the first and the second power source switch 251 and 252 are connected to the external pad, there is a possibility that the control circuit outside of the semiconductor device 200 becomes complicated besides an increase in the manufacturing cost and the development cost since the number of pads of the semiconductor device 200 increases.

Figure 1C:
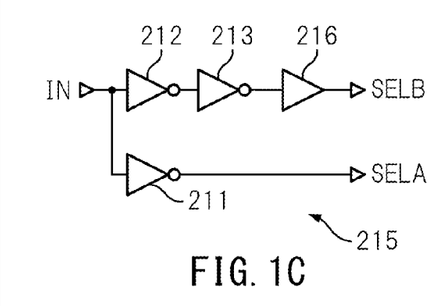
FIG. 1C is a diagram illustrating a power source selection circuit of SRAM cells.
Figure 1D:
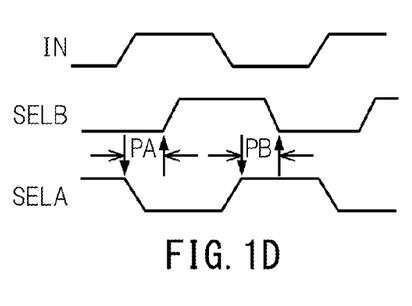
FIG. 1D is a diagram illustrating a timing chart of the memory cell illustrated in FIG. 1C.

As a fourth way, shifting the timing of the first selection signal SELA of the first power source switch 251 and the timing of the second selection signal SELB of the second power source switch 252. FIG. 1C is a diagram illustrating a power source selection unit 215 configured to delay the second selection signal SELB by causing the second selection signal SELB to pass through a buffer 216. FIG. 1D is a diagram illustrating a timing chart of the power source selection unit 215 illustrated in FIG. 1C. By the second selection signal SELB delaying by passing through the buffer 216, after the first selection signal SELA falls and a period of time PA elapses, the second selection signal SELB rises. Then, when the second selection signal SELB rises, the first and the second power source switch 251 and 252 do not turn on at the same time. However, when the second selection signal SELB falls, the second selection signal SELB falls after the first selection signal SELA rises, and therefore, the first and the second power source switch 251 and 252 turn on at the same time and a through current flows.

As a fifth way, preventing occurrence of a leak current from the sleep power source VSLEEP to the normal power source VSS by inserting a diode between the second power source switch 252 and the sleep power source VSLEEP. However, the tendencies of manufacturing variations differ between the SRAM cell and the diode, and therefore, it is desired to carry out a verification in view of the manufacturing variations of both the SRAM cell and the diode, resulting in a possibility that the verification cost and the design cost are raised. As a result, it is not preferable to arrange a diode inside of the SRAM cell.

Hereinafter, a semiconductor device having a power source selection circuit is explained with reference to FIGS. 2 to 7. First, a first embodiment of a semiconductor device having a power source selection circuit according to an embodiment is explained with reference to FIGS. 2 to 4.

Figure 2:
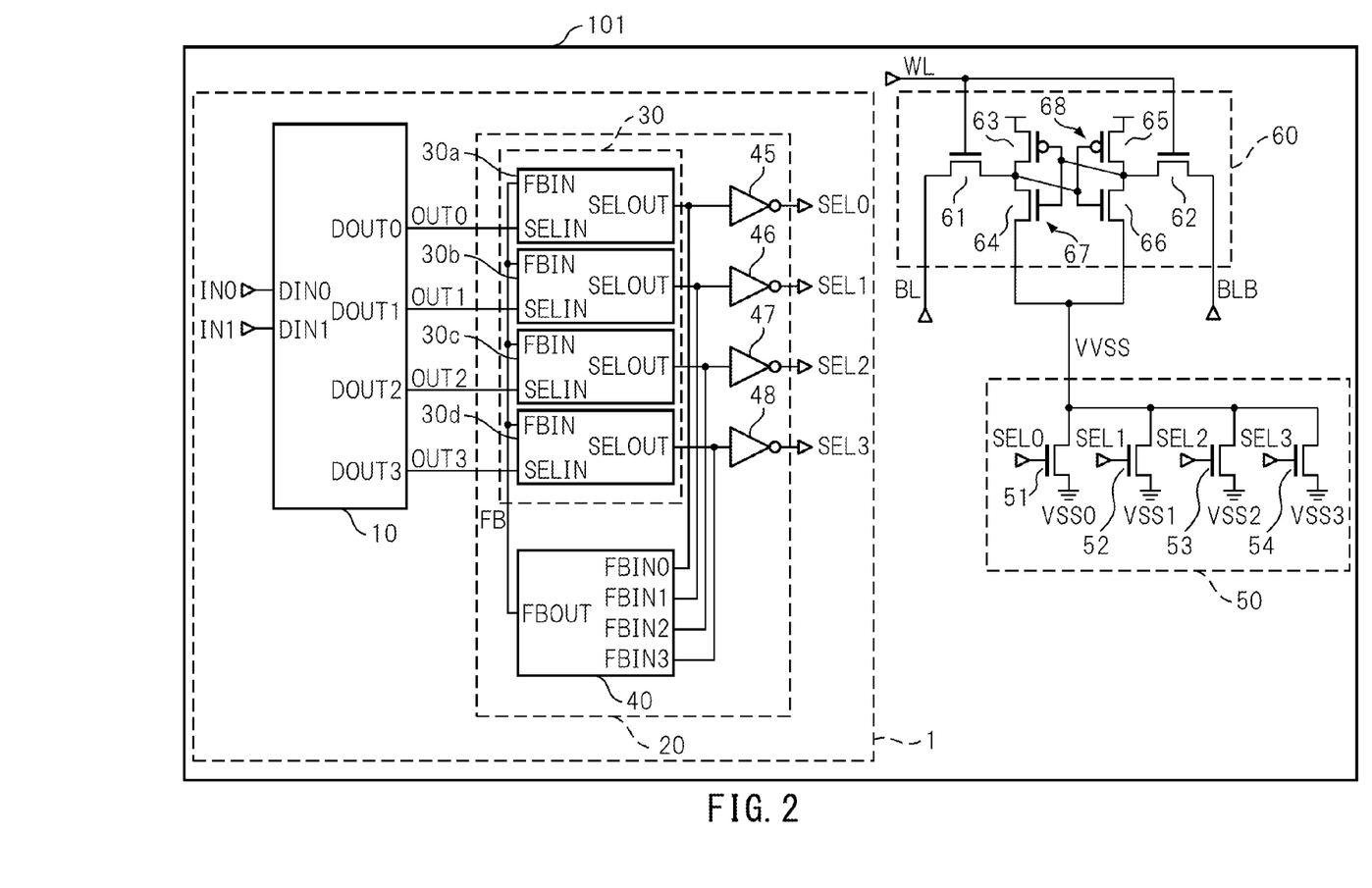
FIG. 2 is a diagram illustrating an example of a semiconductor device having a power source selection circuit.

FIG. 2 is a diagram illustrating an example of a semiconductor device having a power source selection circuit.

A semiconductor device 101 has an SRAM cell 60, a power source unit 50 configured to selectively supply a negative power source to the SRAM cell 60, and a power source selection circuit 1.

The SRAM cell 60 has a six-transistor configuration and has a first and a second transfer gate 61 and 62, a first and a second pull-up transistor 63 and 65, and a first and a second pull-down transistor 64 and 66. The first pull-up transistor 63 and the first pull-down transistor 64 form a first inverter 67 and the second pull-up transistor 65 and the second pull-down transistor 66 form a second inverter 68. The first and the second inverter 67 and 68 form a latch structure. The gate terminals of the first and the second transfer gate 61 and 62 are connected to a word line WL. The external terminal of the first transfer gate 61 is connected to a first bit line BL and the internal terminal of the first transfer gate 61 is connected to one end of the latch formed by the first and the second inverter 67 and 68. The external terminal of the second transfer gate 62 is connected to a second bit line BLB which is input an inverted signal of the first bit line BL, and the internal terminal of the second transfer gate 62 is connected to the other end of the latch formed by the first and the second inverter 67 and 68.

The power source unit 50 has a first power source VSS0, a second power source VSS1, a third power source VSS2, and a fourth power source VSS3, and a first to a fourth power source switch 51 to 54 connected in series to the first to the fourth power source VSS0 to VSS3, respectively. The first to the fourth power source switch 51 to 54 each have an nMOS transistor and the drain terminal is connected to a negative power source terminal VVSS of the SRAM cell 60. A first selection signal SEL0 output from the power source selection circuit 1 is input to the gate terminal of the first power source switch 51, and the source terminal is connected to the first power source VSS0. A second selection signal SEL1 output from the power source selection circuit 1 is input to the gate terminal of the second power source switch 52, and the source terminal is connected to the second power source VSS1. A third selection signal SEL2 output from the power source selection circuit 1 is input to the gate terminal of the third power source switch 53, and the source terminal is connected to the third power source VSS2. A fourth selection signal SEL3 output from the power source selection circuit 1 is input to the gate terminal of the fourth power source switch 54, and the source terminal is connected to the fourth power source VSS3. The first to the fourth power source switch 51 to 54 each turn on when the first to the fourth selection signal SEL0 to SEL3 are each at the H level and turn off when the first to the fourth selection signal SEL0 to SEL3 are each at the L level.

The power source selection circuit 1 has a power source selection unit 10 and a feedback control unit 20.

The power source selection unit 10 outputs one of a first to a fourth output signal OUT0 to OUT3 as a selection signal in order to select one of the first to the fourth power source VSS0 to VSS3 based on a first and a second selection input signal IN0 and IN1.

The feedback control unit 20 has a control unit 30 having a first to a fourth control circuit 30a to 30d, a feedback unit 40, and a first to a fourth inverter element 45 to 48.

OUT0 to OUT3 output from the power source selection unit 10 are input to selection input terminals SELIN of the first to the fourth control circuit 30a to 30d, respectively. A feedback signal FB output from the feedback unit 40 is input to a feedback input terminal FBIN of each of the first to the fourth control circuit 30a to 30d. When a selection signal is input to the selection input terminal SELIN and the feedback signal FB input to the feedback input terminal FBIN is a signal indicative of feedback permission, the first to the fourth control circuit 30a to 30d each output an on command signal. When an off command signal to open electrical connections between the SRAM cell 60 and the negative power sources VSS0 to VSS3 is transmitted from each of the first to the fourth control circuit 30a to 30d, the feedback signal FB becomes a signal indicative of feedback permission. The off command signal and the on command signal are input from the output terminals of the first to the fourth control circuit 30a to 30d to the gate terminals of the first to the fourth power source switch 51 to 54 as the first to the fourth selection signal SEL0 to SEL3 via the first to the fourth inverter 45 to 48.

A first to a fourth input terminal FBIN0 to FBIN3 of the feedback unit 40 are connected to selection output terminals SELOUT of the first to the fourth control circuit 30a to 30d, respectively. The feedback unit 40 outputs a signal indicative of feedback permission as the feedback signal FB from an output terminal FBOUT when a predetermined delay time elapses after the off command signal is output from all of the selection output terminals SELOUT of the first to the fourth control circuit 30a to 30d.

The feedback control unit 20 feeds back a signal indicative of that the off command signal to turn off the electrical connections between the four power sources VSS0 to VSS3 and the SRAM cell 60 is transmitted to all of the first to the fourth power source switch 51 to 54. Then, the feedback control unit 20 transmits an on command signal to turn on the electrical connection between a selected power source and the SRAM cell 60 to one of the first to the fourth power source switch 51 to 54 to be connected to the selected power source.

Figures 3A, 3B, 3C:
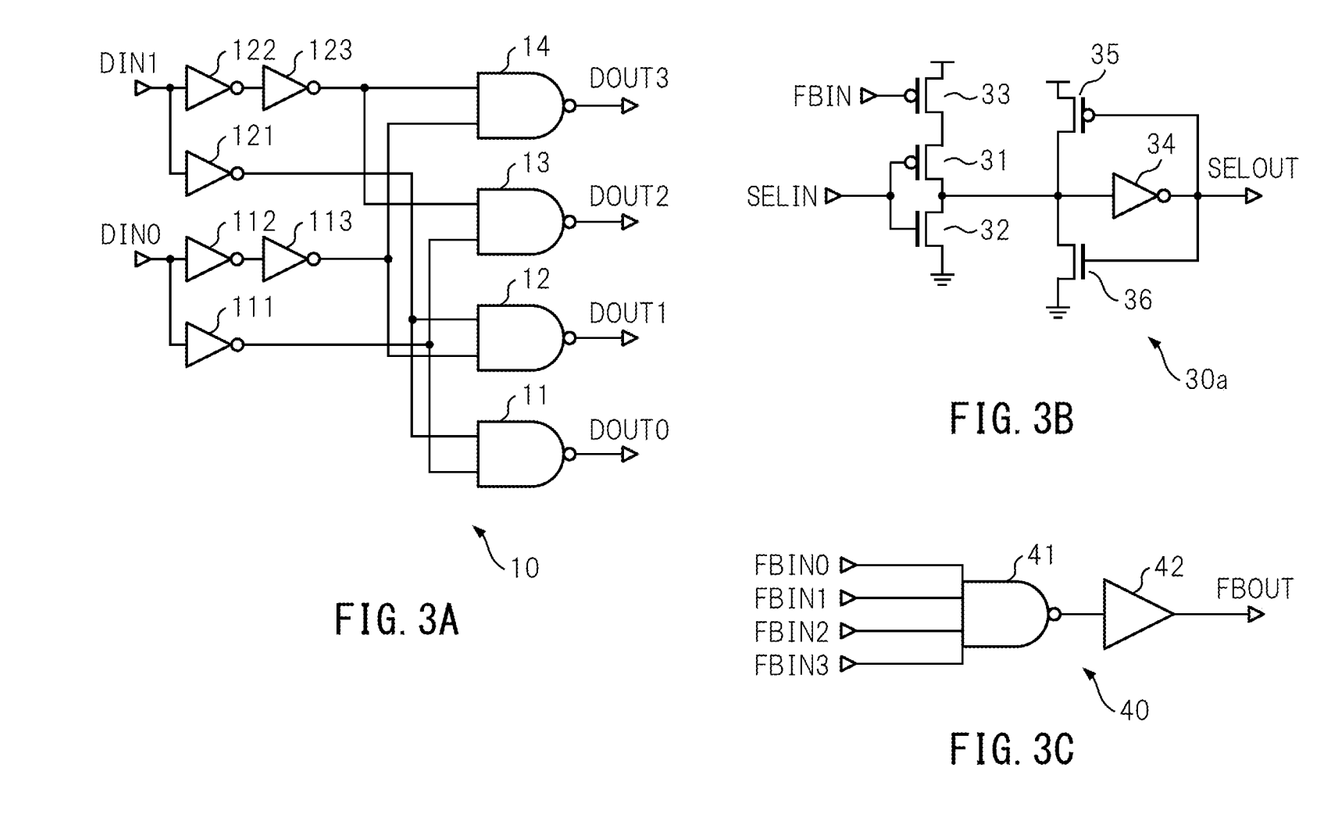
FIG. 3A is an internal circuit diagram of the power source selection unit illustrated in FIG. 2.
FIG. 3B is an internal circuit diagram of the first control circuit illustrated in FIG. 2.
FIG. 3C is an internal circuit diagram of the feedback unit illustrated in FIG. 2.

FIG. 3A is an internal circuit diagram of the power source selection unit 10.

The power source selection unit 10 has a first to a sixth inverter element 111 to 113 and 121 to 123, and a first to a fourth NAND element 11 to 14.

The first inverter element 111 outputs an inverted signal of a signal input to a first input terminal DIN0 from the output terminal. The second and the third inverter element 112 and 113 are connected in series and output a non-inverted signal of a signal input to the first input terminal DIN0 from the output terminal of the third inverter element 113. The fourth inverter element 121 outputs an inverted signal of a signal input to a second input terminal DIN1 from the output terminal. The fifth and the sixth inverter element 122 and 123 are connected in series and output a non-inverted signal of a signal input to the second input terminal DIN1 from the output terminal of the sixth inverter element 123.

The input terminals of the first NAND element 11 are connected to the output terminal of the first inverter element 111 and the output terminal of the fourth inverter element 121, respectively. The first NAND element 11 outputs an L-level signal to a first output terminal DOUT0 when an L-level signal is input to both the first input terminal DIN0 and the second input terminal DIN1.

The input terminals of the second NAND element 12 are connected to the output terminal of the third inverter element 113 and the output terminal of the fourth inverter element 121, respectively. The second NAND element 12 outputs an L-level signal to a second output terminal DOUT1 when an H-level signal and an L-level signal are input to the first and the second input terminal DIN0 and DIN1, respectively.

The input terminals of the third NAND element 13 are connected to the output terminal of the first inverter element 111 and the output terminal of the sixth inverter element 123, respectively. The third NAND element 13 outputs an L-level signal to a third output terminal DOUT2 when an L-level signal and an-H level signal are input to the first and the second input terminal DIN0 and DIN1, respectively.

The input terminals of the first NAND element 14 are connected to the output terminal of the third inverter element 113 and the output terminal of the sixth inverter element 123, respectively. The second NAND element 14 outputs an L-level signal to a fourth output terminal DOUT3 when an H-level signal is input to both the first input terminal DIN0 and the second input terminal DIN1.

FIG. 3B is an internal circuit diagram of the first control circuit 30a. Although FIG. 3B is an internal circuit diagram of the first control circuit 30a, the second to the fourth control circuit 30b to 30d also have the same configuration as the internal circuit of the first control circuit 30a.

The first control circuit 30a has a first pMOS transistor 31, a first nMOS transistor 32, a second pMOS transistor 33, an inverter element 34, a third pMOS transistor 35, and a second nMOS transistor 36.

The gate terminals of the first pMOS transistor 31 and the first nMOS transistor 32 are connected to the selection input terminal SELIN and the gate terminal of the second pMOS transistor 33 is connected to the feedback input terminal FBIN. The first and the second pMOS transistor 31 and 33 and the first nMOS transistor 32 are connected in series. The source terminal of the second pMOS transistor 33 is connected to a positive power source VDD and the drain terminal of the second pMOS transistor 33 is connected to the source terminal of the first pMOS transistor 31. The drain terminal of the first pMOS transistor 31 is connected to the drain terminal of the first nMOS transistor 32 and the source terminal of the first nMOS transistor 32 is connected to a negative power source.

The input terminal of the inverter element 34 is connected to the drain terminals of the first pMOS transistor 31 and the first nMOS transistor 32. Further, the input terminal of the inverter element 34 is connected to the drain terminals of the third pMOS transistor 35 and the second nMOS transistor 36. The output terminal of the inverter element 34 is connected to the selection output terminal SELOUT. Further, the output terminal of the inverter element 34 is connected to the gate terminals of the third pMOS transistor 35 and the second nMOS transistor 36. The source terminal of the third pMOS transistor 35 is connected to a positive power source and the source terminal of the second nMOS transistor 36 is connected to a negative power source. The third pMOS transistor 35 and the second nMOS transistor 36 have a function to latch a signal of the input terminal of the inverter element 34.

Regardless of a signal input to the feedback input terminal FBIN, if an H-level signal is input to the selection input terminal SELIN of the first control circuit 30a, an H-level signal is output from the selection output terminal SELOUT.

While an H-level signal is input to the feedback input terminal FBIN of the first control circuit 30a, if the signal to be input to the selection input terminal SELIN transits from the H level to the L level, the selection output terminal SELOUT continues outputting an H-level signal.

While an L-level signal is input to the selection input terminal SELIN of the first control circuit 30a, if the signal to be input to the feedback input terminal FBIN transits from the H level to the L level, the signal of the selection output terminal SELOUT transits from the H level to the L level. Subsequently, if the signal to be input to the selection input terminal SELIN of the first control circuit 30a transits from the L level to the H level, the signal of the selection output terminal SELOUT transits from the L level to the H level.

FIG. 3C is an internal circuit diagram of the feedback unit 40.

The feedback unit 40 has a four-input NAND element 41 and a delay element 42. A first to a fourth input terminal of the four-input NAND element 41 are connected to the first to the fourth feedback input terminal FBIN0 to FBIN3 and the output terminal is connected to the input terminal of the delay element 42. The delay element 42 delays a non-inverted signal of the input signal and outputs the delayed signal to the feedback output terminal FBOUT. The delay time of the delay element 42 is defined so that the delay time of the delay element 42 is longer than the period of time from the time when the first to the fourth selection signal SEL0 to SEL3, which are all at the L level, are transmitted from the control circuit 30, to time when all of the first to the fourth power source switch 51 to 54 are turned off.

When an H-level signal is input to all of the first to the fourth feedback input terminal FBIN0 to FBIN3, the feedback unit 40 outputs an L-level signal delayed by a predetermined delay time from the feedback output terminal FBOUT. When an L-level signal is input to one of the first to the fourth feedback input terminal FBIN0 to FBIN3, the feedback unit 40 outputs an H-level signal delayed by a predetermined delay time from the feedback output terminal FBOUT.

Figure 4:
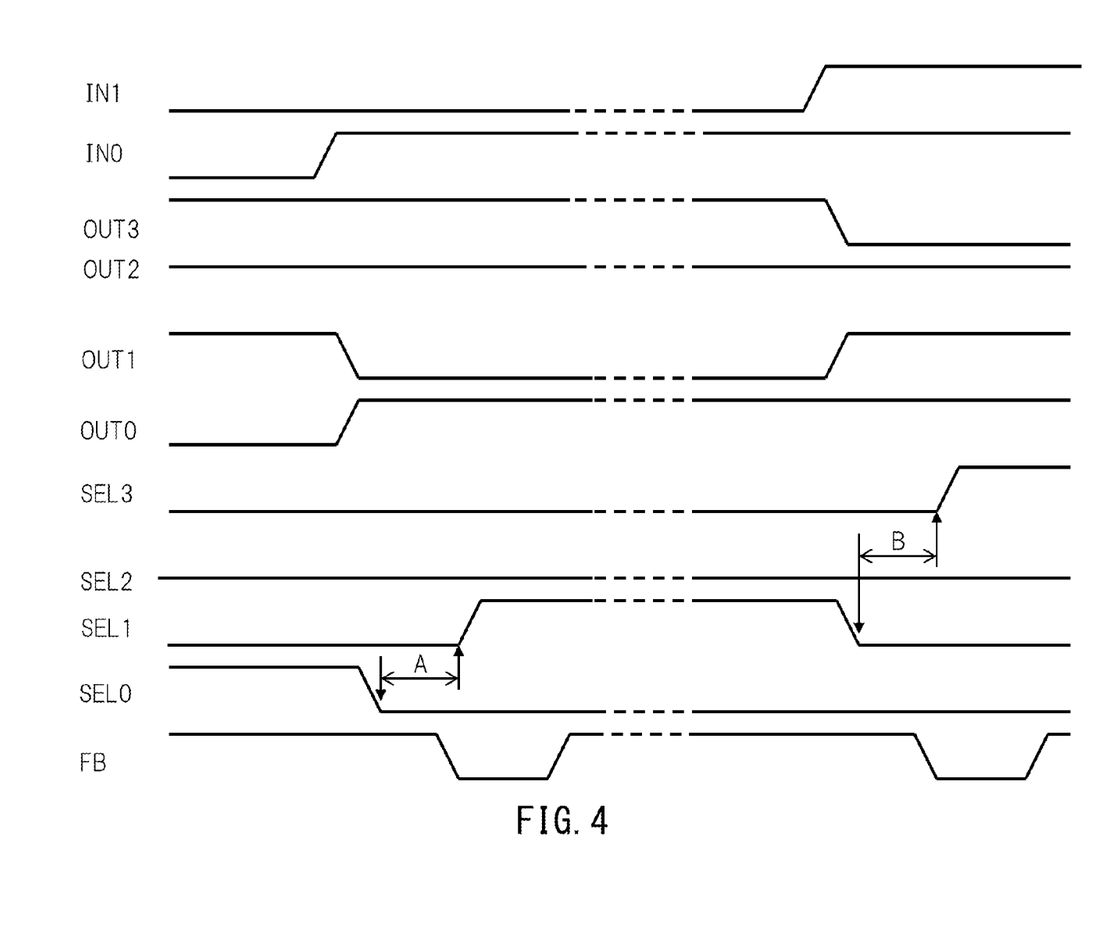
FIG. 4 is a diagram illustrating a timing chart of the power source selection circuit illustrated in FIG. 2.

FIG. 4 is a diagram illustrating a timing chart of the power source selection circuit 1.

While an L-level signal is input to both the first selection input signal IN0 and the second selection input signal IN1, only the first selection signal SEL0 is an H-level signal and the second to the fourth selection signal SEL1 to SEL3 are L-level signals. Thus, the power source selection unit 10 selects the first power source VSS0 and among the first to the fourth power source switch 51 to 54 of the power source unit 50, only the first power source switch 51 is turned on and the negative power source VVSS of the SRAM cell 60 is connected to the first power source VSS0.

Subsequently, if the signal of the first selection input signal IN0 transits from the L level to the H level, the first output signal OUT0 of the power source selection unit 10 transits from the L level to the H level and the second output signal OUT1 transits from the H level to the L level. Then, the power source selection unit 10 switches the power source to select from the first power source VSS0 to the second power source VSS1.

Subsequently, in the first control circuit 30a, the first output signal OUT0 to be input to the selection input terminal SELIN transits from the L level to the H level, and therefore, the signal to be output from the selection output terminal SELOUT transits from the L level to the H level. Subsequently, the first inverter element 45 outputs an L-level signal obtained by inverting the output signal of the selection output terminal SELOUT as the first selection signal SEL0.

On the other hand, in the second control circuit 30b, although the second output signal OUT1 to be input to the selection input terminal SELIN transits from the H level to the L level, the feedback signal FB of the feedback input terminal is at the H level. As a result, the second control circuit 30b keeps the signal output from the selection output terminal SELOUT at the H level and the second selection signal SEL1 is kept at the L level.

All of the first to the fourth selection signal SEL0 to SEL3 are at the L level and all of the first to the fourth power source switch 51 to 54 are in the off state. Thus, the negative power source VVSS of the SRAM cell 60 is not connected to any of the first to the fourth power source VSS0 to VSS3.

Subsequently, the feedback control unit 20 outputs an L-level signal from the feedback output terminal FBOUT as the feedback signal FB when a predetermined delay time elapses after an H-level signal is input to the first feedback input terminal FBIN0.

Subsequently, in the second control circuit 30b, the feedback signal FB to be input to the feedback input terminal FBIN transits to the L level, and therefore, the signal output from the selection output terminal SELOUT transits from the H level to the L level.

Subsequently, the second inverter element 46 outputs an H-level signal obtained by inverting the output signal of the selection output terminal SELOUT to the gate terminal of the second power source switch 52 as the second selection signal SEL1 and thus the second power source switch 52 turns on. Then, the negative power source VVSS of the SRAM cell 60 is connected to the second power source VSS1.

On the other hand, the feedback control unit 20 outputs an H-level signal from the feedback output terminal FBOUT as the feedback signal FB when a predetermined delay time elapses after an L-level signal is input to the second feedback input terminal FBIN1.

Subsequently, in the second control circuit 30b, the feedback signal FB to be input to the feedback input terminal FBIN transits from the L level to the H level. However, the signal output from the selection output terminal SELOUT is at the L level, and therefore, in the second control circuit 30b, the second selection signal SEL1 is kept at the H level.

When the power source selection unit 10 switches the power source to select from the first power source VSS0 to the second power source VSS1, first, as indicated by an arrow A in FIG. 4, the control unit 30 turns the first selection signal SEL0 to L and turns all of the first to the fourth selection signal SEL0 to SEL3 to the L level. All of the first to the fourth power source switch 51 to 54 are turned off. Subsequently, the feedback unit 40 feeds back the feedback signal FB at the L level to the control unit 30 when a predetermined delay time elapses after all of the first to the fourth selection signal SEL0 to SEL3 turn to the L level. When the feedback signal FB at the L level is input from the feedback unit 40, the control unit 30 turns the second selection signal SEL1 to the H level and turns on the second power source switch.

Thus, when the power source selection unit 10 switches the power source to select from the first power source VSS0 to the second power source VSS1, the connection between the first power source VSS0 and the SRAM cell 60 is broken before connecting the second power source VSS1 to the SRAM cell 60. Then, the SRAM cell 60 keeps the state where all the connections with the first to the fourth power source VSS0 to VSS3 are broken during the period of a predetermined delay time until the feedback signal FB at the L level is input to the control unit 30 from the feedback unit 40. Subsequently, when the feedback signal FB at the L level is input, the control unit 30 inputs the second selection signal SEL1 at the H level to the gate terminal of the second power source switch 52 to turn on the second power source switch 52 and connects the second power source VSS1 to the SRAM cell 60.

As a result, when the power source selection unit 10 switches the power source to select from the first power source VSS0 to the second power source VSS1, it is unlikely that both the first power source VSS0 and the second power source VSS1 are connected to the SRAM cell 60. Thus, when the power source selection unit 10 switches the power source to select from the first power source VSS0 to the second power source VSS1, there is no possibility of occurrence of a through current between the first power source VSS0 and the second power source VSS1.

Next, a case where the second selection input signal IN1 transits from the L level to the H level is explained.

If the second selection input signal IN1 transits from the L level to the H level, both the first input signal IN1 and the second input signal IN1 turn to the H level and the power source selection unit 10 turns only the fourth output signal OUT3 to the H level in order to select the fourth power source VSS3.

Subsequently, as indicated by an arrow B in FIG. 4, the control unit 30 turns the second selection signal SEL1 to L and turns all the first to the fourth selection signal SEL0 to SEL3 to the L level. All of the first to the fourth power source switch 51 to 54 are turned off.

Subsequently, the feedback unit 40 feeds back the feedback signal FB at the L level to the control unit 30 when a predetermined delay time elapses after all of the first to the fourth selection signal SEL0 to SEL3 turn to the L level. If the feedback signal FB at the L level is input from the feedback unit 40, the control unit 30 turns the fourth selection signal SEL3 to the H level and turns on the fourth power source switch. Then, the negative power source VVSS of the SRAM cell 60 is connected to the fourth power source VSS3.

In FIG. 4, the case is explained where the power source selection unit 1 switches the power source to select from the first power source VSS0 to the second power source VSS1, and the power source to select from the second power source VSS1 to the fourth power source VSS3. However, also when the power source selection circuit 1 switches the power source from a power source to another power source, the power source selection circuit 1 switches the power sources after feeding back a signal indicative of that an off command signal is output to the first to the fourth power source switch 51 to 54.

As above, the first embodiment of the power source selection circuit is explained.

Next, a second embodiment of a semiconductor device having a power selection circuit is explained with reference to FIGS. 5 and 6.

Figure 5:
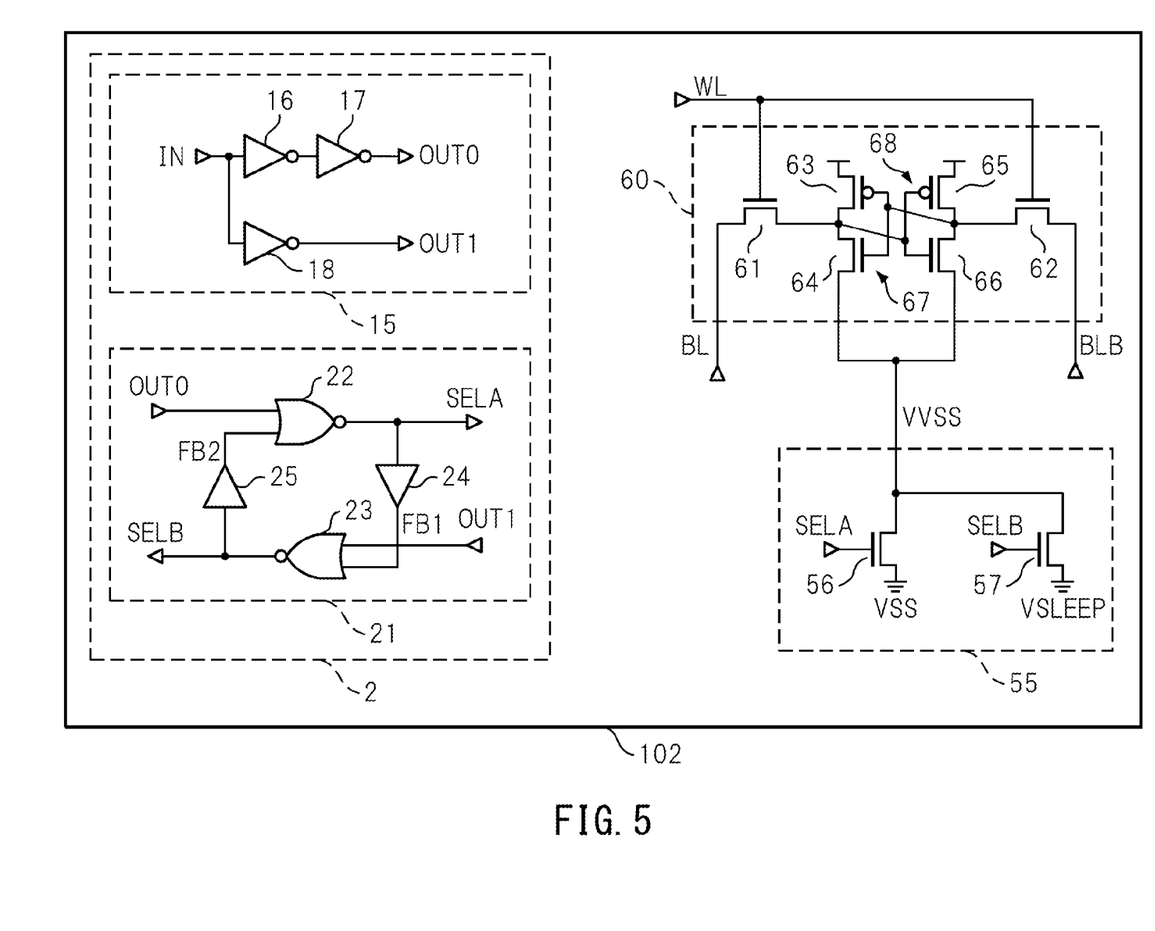
FIG. 5 is a diagram illustrating other example of a semiconductor device having a power source selection circuit.

FIG. 5 is a diagram illustrating a semiconductor device 102 having a power source selection circuit 2.

The semiconductor device 102 has the SRAM cell 60, a power source unit 55 configured to selectively supply a negative power source to the SRAM cell 60, and the power source selection circuit 2.

The power source unit 55 has the normal power source VSS, the sleep power source VSLEEP, and a first and a second power source switch 56 and 57 connected in series to the two power sources, respectively. The first and the second power source switch 56 and 57 each have an nMOS transistor and the drain terminals are connected to the negative power source of the SRAM cell 60. A first selection signal SELA output from the power source selection circuit 2 is input to the gate terminal of the first power source switch 56, and the source terminal is connected to the normal power source VSS. A second selection signal SELB output from the power source selection circuit 2 is input to the gate terminal of the second power source switch 57, and the source terminal is connected to the sleep power source VSLEEP. The first power source switch 56 turns on when the first selection signal SELA is at the H level and turns off when the first selection signal SELA is at the L level. The second power source switch 57 turns on when the second selection signal SELB is at the H level and turns off when the second selection signal SELB is at the L level.

The power source selection circuit 2 has a power source selection unit 15 and a feedback control unit 21.

The power source selection unit 15 has a first and a second inverter element 16 and 17 connected in series and a third inverter element 18 connected in parallel to the first and the second inverter element 16 and 17. The power source selection unit 15 outputs the first output signal OUT0 or the second output signal OUT1 as a selection signal in order to select one of the normal power source VSS and the sleep power source VSLEEP based on a selection input signal IN.

The feedback control unit 21 has a first and a second logical OR element 22 and 23, and a first and a second delay element 24 and 25. The first logical OR element 22 outputs an inverted signal of a logical OR of the first output signal OUT0 of the power source selection unit 15 and a second feedback signal FB2 as the first selection signal SELA. The second feedback signal FB2 is an output signal of the second delay element. The second logical OR element 23 outputs an inverted signal of a logical OR of the second output signal OUT1 of the power source selection unit 15 and a first feedback signal FB1 as the second selection signal SELB. The first feedback signal FB1 is an output signal of the first delay element. The first delay element 24 outputs the first selection signal SELA as the first feedback signal FB1 after a predetermined delay time elapses. The second delay element 25 outputs the second selection signal SELB as the second feedback signal FB2 after a predetermined delay time elapses.

Figure 6:
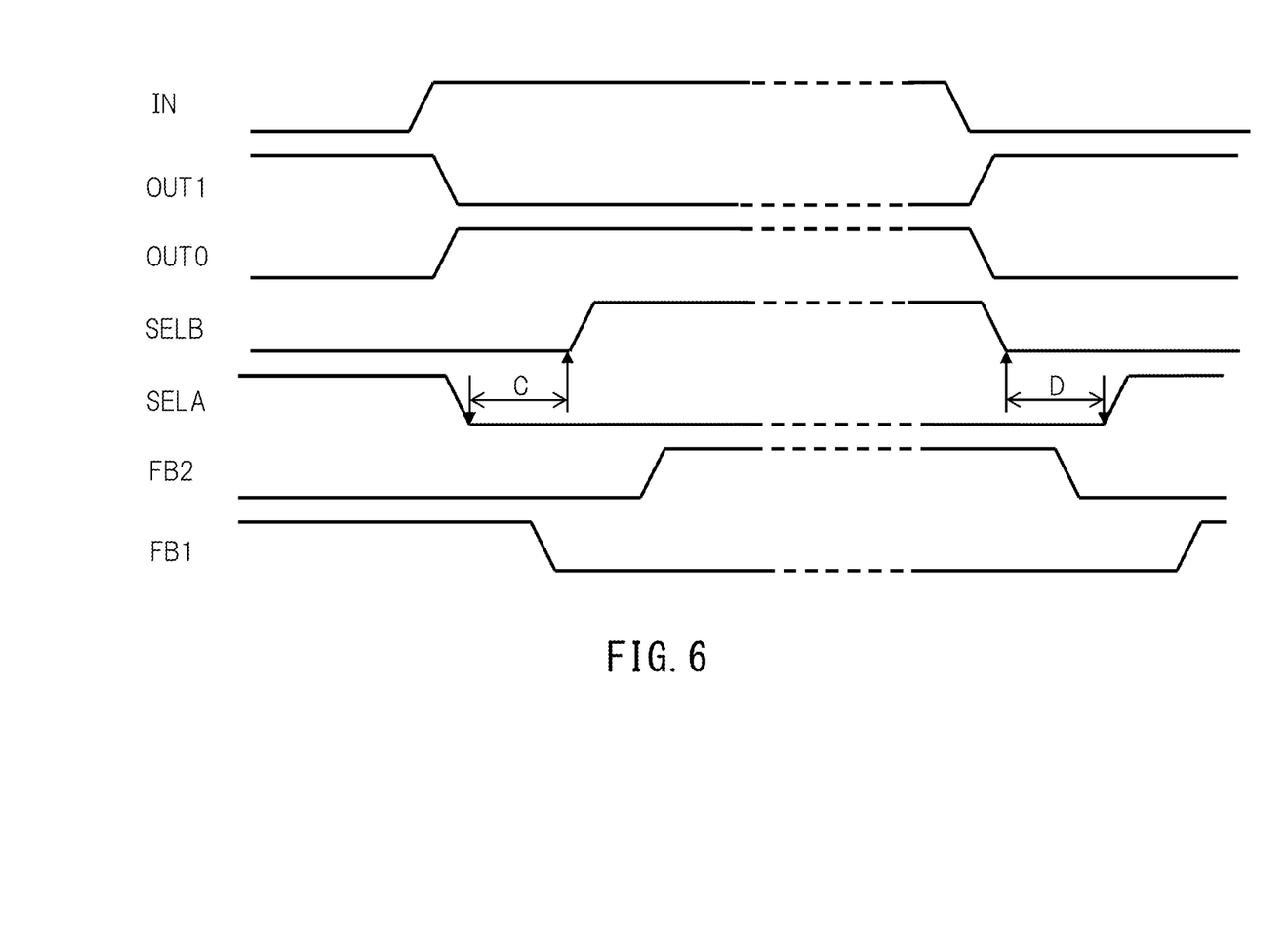
FIG. 6 is a diagram illustrating a timing chart of the power source selection circuit illustrated in FIG. 5.

FIG. 6 is a diagram illustrating a timing chart of the power source selection circuit 2.

While an L-level signal is input to the selection input signal IN, the first selection signal SELA is an H-level signal and the second selection signal is an L-level signal. Thus, the power source selection unit 10 selects the normal power source VSS, the first power source switch 56 is turned on, and the negative power source VVSS of the SRAM cell 60 is connected to the normal power source VSS.

Subsequently, if the selection input signal IN transits from the L level to the H level, the first output signal OUT0 of the power source selection unit 15 transits from the L level to the H level and the second output signal OUT1 transits from the H level to the L level. Then, the power source selection unit 15 switches the power source to select from the normal power source VSS to the sleep power source VSLEEP.

Subsequently, since the second feedback signal to be input to one input terminal is at the L level and the first output signal OUT0 to be input to the other input terminal transits from the L level to the H level, the first logical OR element 22 causes the first selection signal SELA to transit from the H level to the L level.

On the other hand, in the second logical OR element 23, although the second output signal OUT1 to be input to one input terminal transits from the H level to the L level, the first feedback signal FB1 to be input to the other input terminal remains at the H level. Thus the second selection signal SELB is kept at the L level.

All of the first and the second selection signal SELA and SELB are at the L level, all of the first and the second switch 56 and 57 are in the off state, and the negative power source VVSS of the SRAM cell 60 is not connected to any of the normal power source VSS and the sleep power source VSLEEP.

Subsequently, the first delay element 24 inputs the first feedback signal FB1 to the second logical OR element 23 when a predetermined delay time elapses after the first selection signal SELA transits to the L level.

Subsequently, in the second logical OR element 23, both of the second selection signal SELB and the first feedback signal FB1 to be input transit to the L level, and therefore, the second selection signal transits from the L level to the H level. Then, the negative power source VVSS of the SRAM cell 60 is connected to the sleep power source VSLEEP.

Subsequently, the second delay element 25 inputs the second feedback signal FB2 to the first logical OR element 22 when a predetermined delay time elapses after the second selection signal SELB transits to the H level. Since the first output signal OUT0, which is the other input signal, is at the H level, the second delay element 25 keeps the first selection signal SELA at the H level.

When the power source selection unit 15 switches the power source to select from the normal power source VSS to the sleep power source VSLEEP, first, as indicated by an arrow C in FIG. 6, the first logical OR element 22 turns the first selection signal SELA to L and turns both the first selection signal SELA and the second selection signal SELB to the L level. Both of the first power source switch 56 and the second power source switch 57 are turned off. Subsequently, the first delay element 24 feeds back the first feedback signal FB1 to the second logical OR element 23 when a predetermined delay time elapses after both the first selection signal SELA and the second selection signal SELB turn to the L level. When the first feedback signal FB1 at the L level is input, the second logical OR element 23 turns the second feedback signal FB2 to the H level and turns on the sleep power source VSLEEP.

Thus, when the power source selection unit 15 switches the power source to select from the normal power source VSS to the sleep power source VSLEEP, before the sleep power source VSLEEP is connected to the SRAM cell 60, the connection between the normal power source VSS and the SRAM cell 60 is broken. Then, the SRAM cell 60 keeps the state where the connections with both the normal power source VSS and the sleep power source VSLEEP are broken for a predetermined delay time until the first feedback signal FB1 at the L level is input from the first delay element 24 to the second logical OR element 23. Subsequently, when the first feedback signal FB1 at the L level is input, the second logical OR element 23 inputs the second selection signal SELB at the H level to the gate terminal of the second power source switch 57 to turn on the second power source switch 57, and connects the sleep power source VSLEEP to the SRAM cell 60.

As a result, when the power source selection unit 15 switches the power source to select from the normal power source VSS to the sleep power source VSLEEP, it is unlikely that both the normal power source VSS and the sleep power source VSLEEP are connected to the SRAM cell 60. Thus, when the power source selection unit 15 switches the power source to select from the normal power source VSS to the sleep power source VSLEEP, there is no possibility of occurrence of a through current between the normal power source VSS and the sleep power source VSLEEP.

Next, a case where the selection input signal IN transits from the H level to the L level is explained.

If the selection input signal IN transits from the H level to the L level, the power source selection unit 15 turns the first output signal OUT0 to the L level and the second output signal OUT1 to the H level in order to select the normal power source VSS.

Subsequently, as illustrated by an arrow D in FIG. 6, the feedback control unit 21 turns the second selection signal SELB to L and turns both the first selection signal SELA and the second selection signal SELB to the L level. Both the first power source switch 56 and the second power source switch 57 are turned off.

Subsequently, the second delay element 25 feeds back the second feedback signal FB2 at the L level to the first logical OR element 22 when a predetermined delay time elapses after both the first selection signal SELA and the second selection signal SELB turn to the L level. When the second feedback signal FB2 at the L level is input from the second delay element 25, the first logical OR element 22 turns the first selection signal SELA to the H level to turn on the first power source switch. Then, the negative power source VVSS of the SRAM cell 60 is connected to the normal power source VSS.

As above, the second embodiment of the power source selection circuit is explained. It is possible to reduce the circuit scale of the power source selection circuit 2 since the feedback control unit 21 is formed by two logical OR elements and two delay elements. Further, in the power source selection circuit 2, the feedback control unit is formed by two logical OR elements and two delay elements, however, it may also be possible to adopt a circuit configuration equivalent as a logic circuit.

Another embodiment is explained below.

Each of the power source selection circuits 1 and 2 switches the power source switches connected to the power source of the single SRAM cell 60, however, it may also be possible to switch power sources of a single or a plurality of other electric circuits. Further, each of the power source selection circuits 1 and 2 switches the power source switches connected to the negative power source of the SRAM cell 60, however, it may also be possible to switch the power source switches connected to the positive power source of the SRAM cell 60.

Figure 7A:
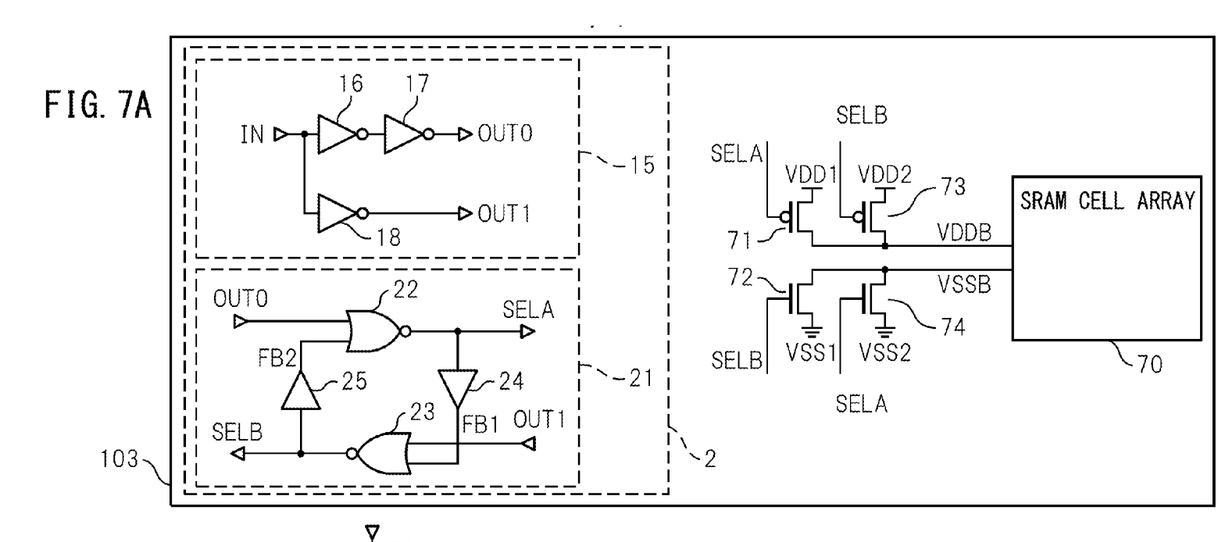
FIGS. 7A and 7B are diagrams illustrating other example of a semiconductor device having a power source selection circuit.
Figure 7B:
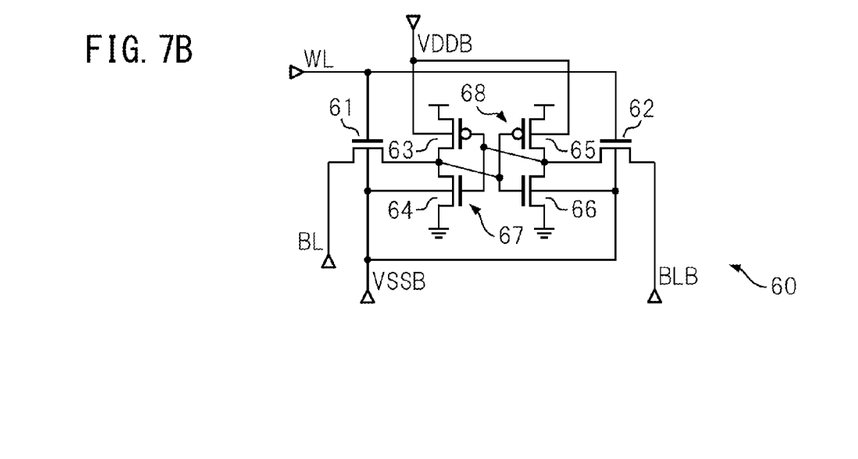

FIGS. 7A and 7B are a diagram illustrating an example in which the power source selection circuit 2 is connected to a back bias power source of an SRAM cell array.

A semiconductor device 103 has an SRAM cell array 70, a first P-well power source switch 71, a first N-well power source switch 72, a second P-well power source switch 73, a second N-well power source switch 74, and the power source selection circuit 2.

The SRAM cell array has a plurality of the SRAM cells 60. The P-well of each of the plurality of the SRAM cells 60 is connected to a P-well power source VDDB and the N-well of each of the plurality of the SRAM cells 60 is connected to an N-well power source VSSB.

The gate terminal of the first P-well power source switch 71 is connected to the output terminal of the first logical OR element 22, the source terminal is connected to a first positive power source VDD1 and the drain terminal is connected to the P-well power source VDDB. The gate terminal of the first N-well power source switch 72 is connected to the output terminal of the second logical OR element 23, the source terminal is connected to a first negative power source VSS1, and the drain terminal is connected to the N-well power source VSSB. The gate terminal of the second P-well power source switch 73 is connected to the output terminal of the second logical OR element 23, the source terminal is connected to a second positive power source VDD2, and the drain terminal is connected to the P-well power source VDDB. The gate terminal of the second N-well power source switch 74 is connected to the output terminal of the first logical OR element 22, the source terminal is connected to a second negative power source VSS2, and the drain terminal is connected to the N-well power source VSSB.

The voltage of the second positive power source VDD2 is higher than that of the first positive power source VDD1 and the voltage of the second negative power source VSS2 is lower than that of the first negative power source VSS1. When the operation speed of the SRAM cell 60 is low, by switching the power source from a pair of the first positive power source VDD1 and the first negative power source VSS1 to a pair of the second positive power source VDD2 and the second negative power source VSS2, the leak current is suppressed. As a result, it is possible to apply the semiconductor device 103 to DVFS (Dynamic Voltage and Frequency Scaling).

It is possible to prevent the through current from occurring at the time of power source switching, by adopting the power source selection circuit 2 and switching a pair of the first positive power source VDD1 and the first negative power source VSS1 to a pair of the second positive power source VDD2 and the second negative power source VSS2.

If the connections between a plurality of power sources and the electric circuit are switched by adopting the power source selection circuit according to the embodiments, the electric circuit connected with a single power source after the connections between all of the plurality of power sources and the electric circuit are broken, and therefore, it is possible to stably switch power sources while preventing a plurality of power sources from being connected at the same time.

If the connections between a plurality of power sources and the electric circuit are switched by adopting the power source selection circuit according to the embodiments, the electric circuit is connected with a single power source after the connections between all of the plurality of power sources and the electric circuit are broken, and therefore, there is no possibility that a through current flows between the plurality of power sources.

Further, the input signal of the power source selection circuits according to the embodiments include only the selection signal to select a power source, and therefore, the external input signal can be kept to a minimum and it is possible to simply design the electric circuit.

Furthermore, the power source selection circuits according to the embodiments are not synchronized with a clock signal, and therefore, it is possible to switch power sources at high speed without depending on the clock period. If the speed of power source switching is increased, it is possible to transit to the SLEEP state even in the case where it is not possible to transit transition to the SLEEP state previously in a memory cell in a low-hierarchy, which operates intermittently, not at all times.

the power source selection circuits according to the embodiments prevent occurrence of the through current.

All examples and conditional language provided herein are intended for pedagogical purposes of aiding the reader in understanding the invention and the concepts contributed by the inventor to furthering the art, and are to be construed as limitations to such specifically recited examples and conditions, nor does the organization of such examples in the specification relate to a illustrating of the superiority and inferiority of the invention. Although one or more embodiments of the present invention have been described in detail, it should be understood that the various changes, substitutions, and alterations could be made hereto without departing from the spirit and scope of the invention.

What is claimed is:
1. A semiconductor device comprising:
a plurality of power source switches connected between a plurality of power sources and an electric circuit, respectively, and configured to turn on and off electrical connections between the plurality of power sources and the electric circuit; and
a power source selection circuit configured to turn on and off each of the plurality of power source switches and including:
a power source selection unit configured to select one power source from among the plurality of power sources; and
a feedback control unit configured, when the power source selection unit switches a power source to select to another, to output an on command signal to turn on an electrical connection between the selected power source and the electric circuit to a power source switch to be connected to the selected power source after a signal indicative of that an off command signal to turn off electrical connections between the plurality of power sources and the electric circuit has been output to all of the plurality of power source switches is fed back with a predetermined delay time.

2. The semiconductor device according to claim 1, wherein the feedback control unit includes:
   a control unit configured to output an off command signal to all of the plurality of power source switches when receiving a signal indicative of instructions to select a power source from the power source selection unit, and to output an on command signal to a power source switch to be connected to the selected power source when receiving a signal indicative of that an off command signal has been output to all of the plurality of power source switches; and
   a feedback unit configured to output a signal indicative of that an off command signal has been output to all of the plurality of power source switches to the control unit when the off command signal is output to all of the plurality of power source switches from the control unit.

3. The semiconductor device according to claim 1, wherein the power source selection circuit is a circuit configured to select one of two power sources,
   the feedback control unit has a first and a second logic element, and a first and a second delay element,
   the first logic element outputs an off command signal to a power source switch to be connected to a selected power source and to the first delay element when receiving a non-selection signal,
   the first delay element delays the received off signal and outputs the signal to the second logic element,
   the second logic element outputs an on command signal to a power source switch to be connected to a power source not selected yet, and to the second delay element when receiving a selection signal and the off signal from the first delay element, and
   the second delay element delays the received on signal and outputs the signal to the first logic element.

4. A method for alternatively selecting connections between a plurality of power sources and an electric circuit, the method comprising:
   selecting a power source;
   feeding back a signal indicative of that an off command signal to turn off connections between the plurality of power sources and the electric circuit has been output to all of the plurality of power source switches; and
   outputting an on command signal to turn on an electrical connection between the selected power source and the electrical circuit to a power source switch to be connected to the selected power source after a signal indicative of that an off command signal has been output to all of the plurality of power source switches is fed back with a predetermined delay time.

* * * * *